United States Patent [19]
Turner, Jr.

[11] Patent Number: 6,084,253
[45] Date of Patent: Jul. 4, 2000

[54] LOW VOLTAGE FOUR-LAYER DEVICE WITH OFFSET BURIED REGION

[75] Inventor: Elmer L. Turner, Jr., Dallas, Tex.

[73] Assignee: Teccor Electronics, LP, Irving, Tex.

[21] Appl. No.: 09/260,328

[22] Filed: Mar. 1, 1999

[51] Int. Cl.[7] .......................... H01L 29/74; H01L 31/111
[52] U.S. Cl. .......................... 257/107; 257/112; 257/164; 257/168; 257/173
[58] Field of Search .................................. 257/109, 112, 257/164, 165, 166, 168, 173

[56] References Cited

U.S. PATENT DOCUMENTS

| | | | |
|---|---|---|---|
| 5,429,953 | 7/1995 | Byatt | 437/6 |
| 5,479,031 | 12/1995 | Webb et al. | 257/173 |
| 5,719,413 | 2/1998 | Bernier | 257/174 |
| 5,753,943 | 5/1998 | Okabe et al. | 257/139 |

OTHER PUBLICATIONS

ST SGS–Thomson Microelectronics, Data Sheet p.p. 1/8–8/8, Oct. 1997.
ST SGS–Thomson Microelectronics, Data Sheet SMP Trisil, date unknown.
Handwritten note by Jack L. Turner, Jr., depicting SGS–Thomson Low Voltage (10v) device, Mar., 1997.

Primary Examiner—Ngân V. Ngô
Attorney, Agent, or Firm—Sidley & Austin

[57] ABSTRACT

A four-layer low voltage thyristor device (30) in which the breakover voltage is independent of the holding current. Rather than forming a buried region (38) underlying the emitter region (42), the buried region 38 is formed laterally to the side of the emitter (42). In order to form a low breakover voltage device, the buried region (38) is required to be highly doped, but the resulting junction (40) does not approach the emitter junction (48). A low breakover voltage (5 V–12-V) thyristor can thus be realized.

21 Claims, 2 Drawing Sheets

LOW VOLTAGE FOUR-LAYER DEVICE WITH OFFSET BURIED REGION

TECHNICAL FIELD OF THE INVENTION

The present invention relates in general to thyristors and other four-layer devices, and more particularly to the fabrication of thyristor devices having a very low breakover voltages.

BACKGROUND OF THE INVENTION

Thyristors, Sidactors and other four-layer devices are commonly used to provide overvoltage protection to circuits requiring the same. The Sidactor family of thyristors is a two-terminal device that has bidirectional current carrying capability, and is obtainable at many different breakover voltage values. When utilized in conjunction with telephone lines, for example, of the type in which 220 volt ringing signals are carried, a 250 volt breakover voltage Sidactor can be utilized to allow normal operation of the telephone line, but operate at 250 volts, or greater, in response to lightning strikes or power line crosses to thereby safely clamp the line to a very low voltage. This type of a device provides high surge current capabilities for protecting equipment from damage due to the extraneous voltages that may be coupled to the telephone line.

Many telephone circuits and equipment operate on a −48 volt supply voltage. To that end, Sidactors that operate at a nominal 64 volts are often utilized to protect such type of circuits. A nominally operating 30 volt Sidactor can be advantageously utilized to protect many 24 volt circuits, such as fire alarm and other systems, that are susceptible to extraneous voltages. It can be appreciated that the lines that generally require protection from damage due to extraneous voltages are often in environments where energy from lightning strikes can be induced into the lines, where high voltage AC circuits are in close proximity thereto, and for a host of other reasons.

While low-voltage digital lines, such as those driven by 5-volt TTL drivers are extensively employed in computerized and other equipment, such lines have not yet found a large application in outside installations. However, in view that computer networks and communications are increasing at a substantial rate, such low-voltage lines are being used in environments where overvoltage protection is required. Such overvoltage protection need not be due solely to lightning and power line crosses, but can be due to other standard voltages that are commonly found in indoor equipment.

It is well known in the thyristor and Sidactor field that the impurity level of a semiconductor wafer can be adjusted to thereby achieve a desired breakover voltage. It is commonly known that lightly-doped silicon substrates are characterized by high breakover voltages. As the doping or impurity level of the substrate is increased, the breakover voltage is reduced. It is also well known that the impurity level of a semiconductor material is inversely proportional to the resistivity thereof.

It has also been found that the use of buried regions in the semiconductor substrate facilitates the operational characteristics of Sidactors. See for example U.S. Pat. No. 5,479,031 by Webb. For example, if the Sidactor is constructed so as to have an a P-type emitter 18, an N-type base 16 and P-type substrate 12 or mid-region, a heavily doped P-type buried region 14 can be implanted between the base region 16 and the silicon substrate 12 to thereby reduce the breakover voltage. FIG. 1 is illustrative of this concept. Important advantages are achieved when the buried region 14 is directly beneath the emitter region 18, with the base region 16 material therebetween. Without significantly changing the impurity levels of the emitter 18, base 16 and substrate 12, the breakover voltage can be changed by simply changing the impurity level of the buried region 14. Moreover, in achieving breakover voltages from 250 volts down to 64 volts, the buried region need only be more heavily doped. In like manner, to achieve 30-volt breakover voltage devices, the buried region is required to be even more heavily doped.

As the impurity level of the buried region 14 increases, the junctions 20–26 formed between the buried region 14 and the base region 16 are displaced upwardly toward the emitter region 18. Indeed, as the doping level of the buried region 14 increases, the distance between the buried region-base junction 20 and the base-emitter junction becomes smaller and smaller. The reason for this is that the junction 20 is formed at a location in the semiconductor material where the donor states of one impurity are cancelled by the acceptor states of the opposite impurity. Stated another way, the junction of two semiconductor materials exists where the concentration of one region is equal to the concentration of the other region. The formation of a low breakover voltage Sidactor is not an elementary task.

It has been found that to fabricate nominal 10-volt breakover voltage Sidactor devices, the impurity level of the buried region must be so high that the buried region can often be effectively short circuited to the emitter region. In any event, even after fine tuning the processes so as to prevent short circuiting between the buried region and the emitter, the yield of workable devices is low, and thus such devices become costly.

Another problem attendant with the migration upwardly of the junction of the buried region is that the base region under the emitter becomes thinner. The distance of the base region between the emitter junction and the buried region junction defines, in part, a holding current ($I_h$) parameter. The holding current is that current required to maintain an on-state of the device. A thinner base region adversely affects the ability to control a desired holding current.

Various other attempts have been made to make low breakover voltage thyristors. One endeavor involves a semiconductor design in which the breakover voltage occurs at the surface of the device. In other words, the concentration of the impurities at the surface of the device is controlled to achieve a low breakdown voltage.

From the foregoing, it can be seen that a need exists for a method and technique to fabricate low breakover voltage thyristor devices. Another need exists for a technique to fabricate low voltage thyristor devices where the breakover voltage is independent of the holding current. Yet another need exists for a thyristor device which can be reliably made with high yields, thereby reducing the cost of the devices.

SUMMARY OF THE INVENTION

In accordance with the principles and concepts of the invention, there is disclosed a technique for fabricating low-voltage thyristor devices, which technique overcomes the disadvantages and shortcomings of the prior art.

In accordance with a preferred embodiment of the invention, the buried region is laterally offset from the emitter region. The movement of the buried region junction upwardly as a function of the impurity level, does not thereby interfere or otherwise become too close to the emitter junction. In addition, because of the lateral displacement of the buried region from the emitter, the base region underlying the emitter does not vary in thickness as a function of the location of the buried region junction. This essentially makes the breakover voltage independent of the holding current value of the device.

In accordance with another feature of the invention, a deep base is provided to thereby make the mid-region of the substrate thinner. The mid-region of the substrate functions in the four-layer device as a base of one of the regenerative connected transistors. With a thinner base, the gain of the device is higher, thereby allowing the device to remain in an on state with a lower holding current.

In another embodiment, the four-layer thyristor is fabricated utilizing a pair of spaced-apart emitters with the buried region disposed therebetween.

BRIEF DESCRIPTION OF THE DRAWINGS

Further features and advantages will become apparent from the following description of the drawings, in which like referenced characteristics generally refer to the same parts, elements or functions throughout the views, and in which.

DETAILED DESCRIPTION OF THE INVENTION

Figure 1:
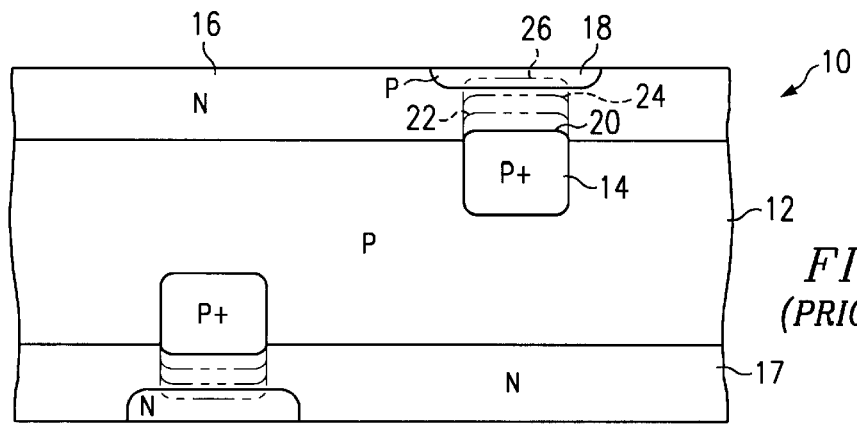
FIG. 1 is a cross-sectional view of a low breakover voltage Sidactor, constructed in accordance with the prior art.
Figure 2:
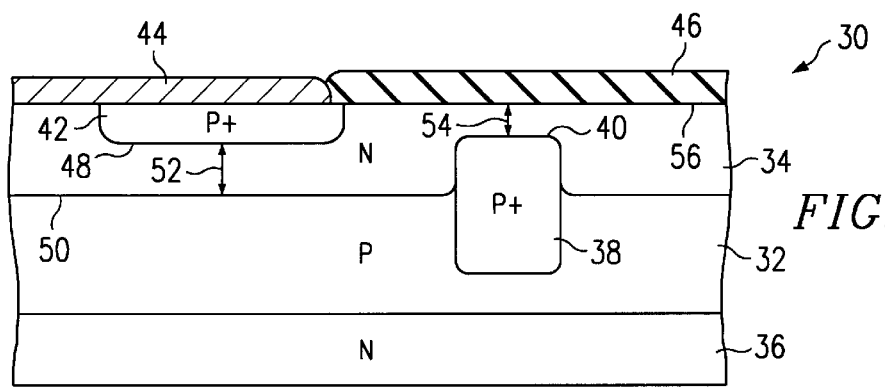
FIG. 2 is a cross-sectional view of a low voltage Sidactor constructed in accordance with the preferred embodiment of the invention.

FIG. 2 illustrates the principles and concepts of the preferred embodiment of the invention. A single four-layer device 30 is illustrated, it being realized that two such devices can be formed in the semiconductor substrate to provide bidirectional current flow capabilities. The device 30 includes a starting silicon substrate 32 of the P-type. Region 32 also defines the mid-region of the four-layer device, and a base of an NPN transistor. An N-type base region 34 for one device is formed in the top surface of the wafer, and a second N-type base 36 for a second device (not shown) is formed in the bottom surface of the wafer. A heavily doped buried region 38 is formed in the substrate 32, preferably by standard semiconductor diffusion techniques and before either base region 34 or 36 is formed. The buried region 38 is formed by depositing boron ions for about three days, resulting in a surface concentration of about $10^{19}$ atoms per $cm^3$, and at a depth of 80 microns. This impurity concentration is effective to provide a breakover voltage in the range of 8–12 volts. The wafer undergoes the diffusion at a temperature of about 1275° centigrade for three days to activate the ions. After activation, a buried region junction 40 is formed in the base region 34. A P-type emitter region 42 is formed in the base region 34, but offset laterally from the buried region 38. A metal emitter contact 44 is formed in electrical contact with the emitter region 42 and the base 34. On the semiconductor wafer overlying the buried region 38, there is formed a dielectric layer 46 of glass, oxide or other electrically insulating material.

As can be seen from FIG. 2, the buried region 38 does not underlie the emitter region 42. Rather, the buried region 38 is offset so that the junction 40 with the base region 34 does not come into close proximity to the emitter-base junction, even when the buried region junction 40 moves upwardly during post implant heat treatment. Any upward movement of the buried region junction 40 is due to the application of high temperatures (1275° C.) to activate the P-type ions. Indeed, even when the buried region junction 40 moves upwardly to any reasonable degree, there is no possibility that it would short circuit with the emitter-base junction.

The holding current $I_h$ of the device 30 is a function of the distance 52 between the emitter-base junction 48 and the base and mid-region junction 50. As can be appreciated, the distance 52 is independent of the location of the buried region junction 40.

The breakover voltage ($VB_O$) of the device 30 is primarily a function of the distance 54 between the buried region junction 40 and the upper surface 56 of the semiconductor wafer. In addition, and as noted above, the impurity concentration of the buried regions 38 also determines the breakover voltage characteristics of the device 30. In accordance an important feature of the invention, the breakover voltage of the device 30, as determined, in part, by the distance 54, is independent of the holding current characteristics, which is determined primarily by the distance 52. Not only can a high concentration buried region 38 be utilized without the attendant problem of short circuiting with the emitter-base junction 48, but the device made according to the invention renders the breakover voltage characteristics independent of the holding current characteristics.

As noted in FIG. 2, and insulating dielectric 46 overlies the buried region 38. The reason for this is that when the device is subjected to an overvoltage, initial breakdown occurs as current flows from the bottom base region 36 to the emitter 42, via the buried region 38. With multiple buried regions, multiple current paths are initially formed, thereby providing a high surge current capability. To force the initial current during breakdown to pass through the emitter region 48 and through the emitter contact 44, the base region above the buried region 38 is covered with the insulator 46. Otherwise, if the metal contact 44 extended over the buried region 38, current would bypass the emitter region 42 and pass directly to the emitter contact 44. Once the current through the device 30 reaches the switching current ($I_s$), the on-state of the device is maintained and current flow need not go through the buried region 38. It can be appreciated from the foregoing that the lateral distance between the emitter region 42 and the buried region 38 should be small to increase the turn on speed of the device, as well as reduce the initial overshoot during turn on. In the fabrication of a bidirectional Sidactor device, two devices (one shown in FIG. 2) can be utilized, one formed on the top surface of the substrate, and the other device formed on the bottom surface.

Figure 3:
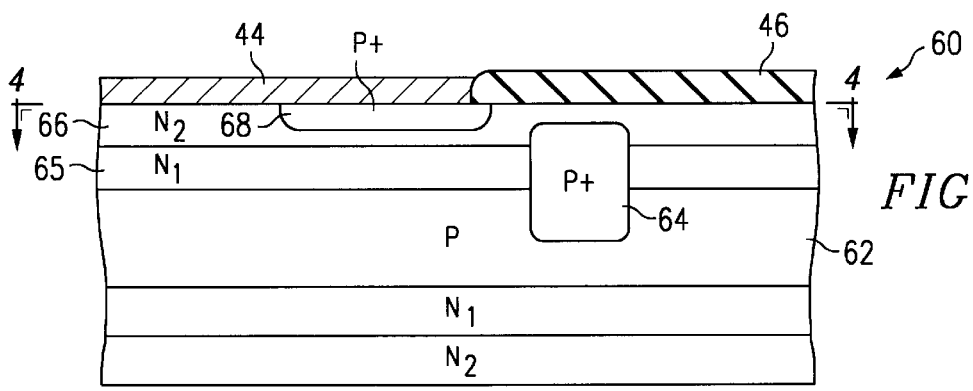
FIGS. 3 and 4 are respective cross-sectional and top views of yet another embodiment of a low voltage Sidactor device having a deep base region to effectively make the mid-region of the substrate thinner, thereby reducing the holding current characteristics of the device.
Figure 4:
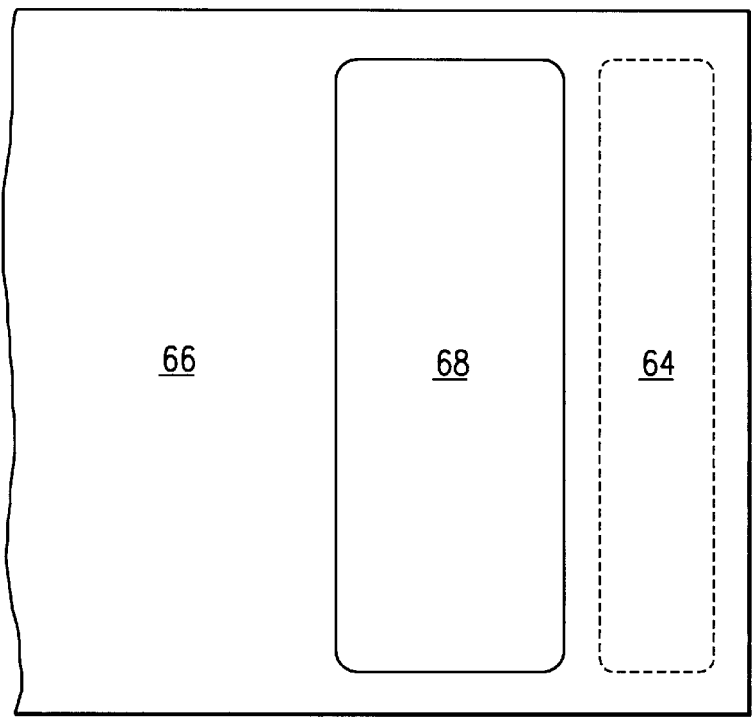

FIG. 3 illustrates another embodiment 60 of the invention having double base regions formed on the top surface of the substrate, and double base regions formed on the bottom surface of the substrate. In the example shown, the substrate or mid-region 62 is employed, and one or more buried regions 64 are formed therein in the manner noted above. A first thick base region 65 is formed in the top surface of the substrate, and doped with an N-type impurity to achieve an 8–10 ohm per square resistivity. A second thinner base region 66 is formed in the first base region 65. The second base region 66 is formed at a higher N-type impurity level with the surface of about $3\times10^{19}$ atoms per cubed centimeter. The heavily doped N-type base region 66 and the heavily doped P-type buried region 64 allow a junction to be formed therebetween. In the top base 66 there is formed a P-type emitter 68. Again, the buried region 64 is laterally offset with respect to the emitter region 68, thereby making the breakover voltage characteristics independent of the holding current characteristics. In addition, by utilizing a double base region in the top and bottom surfaces of the substrate 62, the mid-region 62 is thereby effectively narrowed. The P-type mid-region 62 corresponds to the base of an NPN transistor which forms one-half of the thyristor device. By making the mid-region 62 thinner, and thus the base region of the NPN transistor thinner, the gain of the device is improved and the initial breakover characteristic is improved to reduce the overshoot. FIG. 4 is a top view of the device 60, taken along line 4—4 of FIG. 3.

Figure 5:
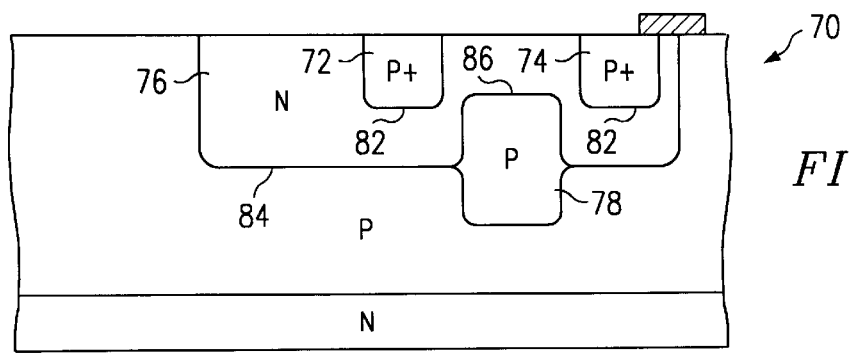
FIGS. 5 and 6 are respective cross-sectional views of a low voltage Sidactor utilizing a buried region disposed between emitter regions.
Figure 6:
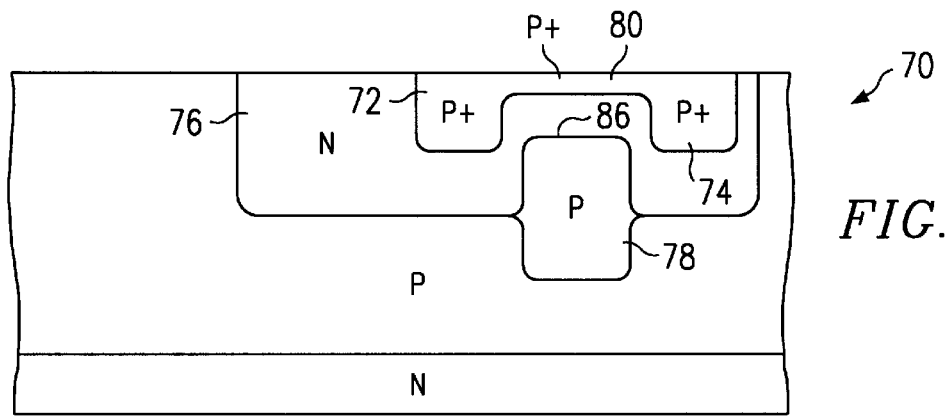

FIGS. 5 and 6 illustrate another embodiment in which the emitter configuration is modified. Here, a pair of spaced apart P-type emitters 72 and 74 are formed in the N-type base region 76. Indeed, each emitter region 72 and 74 is spaced on each side of the buried region 78. As noted in the next step of the process shown in FIG. 6, additional P-type impurities are diff-used into the top surface of the base region to thereby short circuit or bridge the emitters 72 and 74 together. The bottom surface of the junction 82 of each emitter region 72 and 74 can thus be formed as close to the junction 84 as necessary, to improve the gain and turn on characteristics of the device. Again, the distance between the junctions 82 and the junction 84 is independent of the location of the junction 86 formed at the top of the buried region 78.

Figure 7:
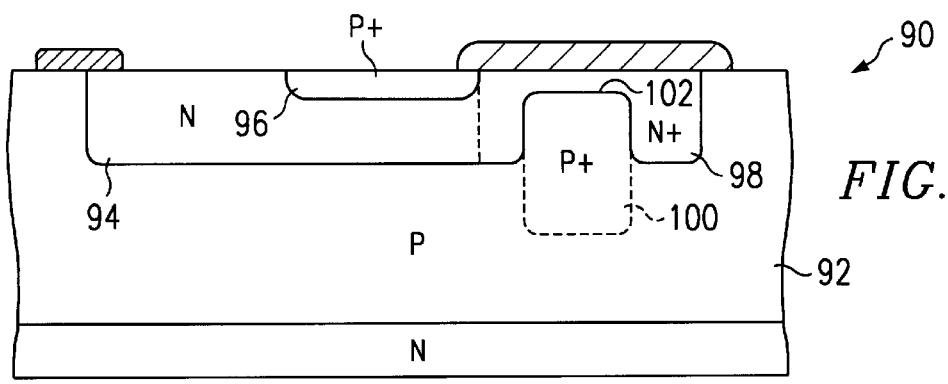
FIG. 7 is a cross-sectional view of a low voltage Sidactor utilizing a base region that has a portion thereof that is lightly doped for improved turn-on performance, and a more heavily doped portion of the base region to control the breakover voltage.

With reference now to FIG. 7 there is illustrated another embodiment 90 of the invention. Here, there is shown a P-type mid-region 92, an N-type base region 94 and a P-type emitter 96 formed therein. The first base region 94 is highly doped, and underlies the emitter region 96. Disposed laterally at the side of the emitter 96, is a more heavily doped second base region 98. A buried region 100 forms a junction 102 in the heavily doped second region 98. Since the more heavily doped base region 98 does not underlie the emitter 96, the turn on characteristics of the device are not substantially affected. With this arrangement, the breakover voltage can be reduced further, thus providing overvoltage protection to low voltage communication lines.

From the foregoing, numerous embodiments of the invention have been disclosed. In any of the embodiments, a breakover voltage of the device can be achieved sufficiently low for protecting TTL digital lines, and the like. In addition, other equipment susceptible to extraneous high voltages can be protected with the foregoing devices. A common characteristics of each of the devices is that the buried region is located laterally and adjacent to the emitter so that the position of the junction of the buried region is independent of the distance between the emitter-base junction and the base-mid-region junction. Stated another way, with these designs, the breakover voltage is independent of the holding current of the device.

While the preferred and other embodiments of the invention have been disclosed with reference to specific semiconductor techniques and methods of operation, it is to be understood that changes in detail may be made as a matter of design choices, without departing from the spirit and scope of the invention, as defined by the appended claims. For example, the devices may be fabricated utilizing impurities of the opposite type, other than those disclosed above.

I claim:

1. A thyristor device, comprising:
   an emitter region;
   a first base region having formed therein said emitter region;
   a mid-region;
   a second base region; and and
   a buried region formed in said mid-region and defining a junction with said first base region, said buried region having an impurity concentration as a function of a breakdown voltage, and said buried region being laterally offset from said emitter region so that the breakdown voltage is substantially independent of a holding current of said thyristor device.

2. The thyristor device of claim 1, wherein said first and second base regions are formed in opposite faces of a semiconductor chip.

3. The thyristor device of claim 1, wherein said first and second base regions are constructed with the same type of impurity.

4. The thyristor device of claim 1, further including a plurality of emitter regions, each laterally spaced from each other, and wherein said buried region is formed so as to be laterally disposed between said plural emitter regions.

5. The thyristor device of claim 4, further including a conductive semiconductor area bridging each said emitter.

6. The thyristor device of claim 1, further including forming said first base region with two distinct concentrations levels.

7. The thyristor device of claim 6, wherein said distinct concentration levels of said first base region are located laterally with respect to each other.

8. The thyristor device of claim 6, wherein said distinct concentration levels of said first base region are located vertically with respect to each other.

9. The thyristor device of claim 1, further including a dielectric formed on a surface of a semiconductor chip in which said device is formed, said dielectric functioning to cause current to flow between said buried region and said emitter region.

10. The thyristor device of claim 8, wherein the junction of said buried region is formed in one distinct concentration level that is more heavily doped than another distinct concentration level.

11. The thyristor device of claim 8, wherein said first and second base regions and said mid-region define a transistor, said mid-region defining a base of said transistor, and one said distinct concentration level being effective to thin said transistor base region.

12. The thyristor device of claim 11, wherein the junction of said buried region is formed in one distinct concentration level having a given impurity concentration, and another distinct concentration level having a lower impurity concentration level is effective to thin said transistor base region.

13. The thyristor device of claim 1, wherein said buried region is formed with an impurity concentration of about $10^{19}$ atoms per $cm^3$.

14. The thyristor device of claim 13, wherein said buried region is formed by a diffusion of said atoms for a period of about three days.

15. The thyristor device of claim 1, wherein said breakdown voltage is between 8–12 volts.

16. A thyristor device, comprising:

an emitter region;

a first base region having formed therein said emitter region;

a mid-region;

a second base region;

a buried region formed in said mid-region and defining a junction with said first base region, said buried region having an impurity concentration as a function of a breakdown voltage, and said buried region being laterally offset from said emitter region so that the breakdown voltage is substantially independent of a holding current of said thyristor device; and said first base region having a given impurity concentration level forming a junction with said mid-region, and a higher concentration level in which said buried region junction is formed.

17. The thyristor device of claim 16, wherein said base region having said given impurity concentration level functions to make said mid-region thinner.

18. A method of fabricating a thyristor device, comprising the steps of:

forming a buried region in a semiconductor material;

forming a first base region in said semiconductor material so that a junction is formed between said buried region and said first base region, an impurity level of said buried region substantially defining a breakdown voltage of said device;

forming an emitter region in said first base region, and forming said emitter region and said buried region laterally offset from each other so that the breakdown voltage is substantially independent from a holding current of the device; and forming a second base region in said semiconductor material at a location so as to form a mid-region between said first and second base regions.

19. The method of claim 18, further including forming said buried region such that the breakdown voltage for said device is between about 8–12 volts.

20. The method of claim 18, further including forming said buried region by diffusing an impurity in the semiconductor material to a surface concentration of about $10^{19}$ atoms per $cm^3$.

21. The method of claim 18, further including diffusing said impurity in said buried region for about three days.

* * * * *